March 24, 1953 G. W. FYLER 2,632,849

TELEVISION ANTENNA

Filed Oct. 11, 1949

INVENTOR.
George W. Fyler
BY Norman L. Mueller
Attys.

Patented Mar. 24, 1953 2,632,849

UNITED STATES PATENT OFFICE 2,632,849

TELEVISION ANTENNA

George W. Fyler, Lombard, Ill., assignor to Motorola, Inc., Chicago, Ill., a corporation of Illinois Application October 11, 1949, Serial No. 120,753

7 Claims. (Cl. 250—33)

This invention relates to television antennas and particularly to means for tuning an indoor dipole antenna.

There is an increasing demand by the public for television receivers having built-in antennas. To meet this demand there have been proposed various forms of dipole antennas with elements that are of fixed length and orientation so that the user is not required to adjust the length of the elements or the orientation of the antenna for each individual television channel. In order to obtain optimum response in each channel throughout the wide range of frequencies in both high and low bands, some form of tuning means must be included in the antenna structure. Heretofore the use of such tuning means has necessitated a separate control which the user must operate each time the receiver is tuned to a new channel. It would be very desirable to eliminate this extra tuning step.

An object of the present invention is to provide an improved indoor television antenna of the foregoing type in which the antenna tuning means is ganged with the main tuning means of a television receiver for automatically tuning the antenna when a channel is being selected.

A further object is to provide an improved tuning means of a simple nature for a built-in television antenna, such tuning means being so graduated for the various channels that it can conveniently be ganged with the main tuning means of the television receiver.

A still further object is to provide an improved coupling arrangement between the main tuning means of a television receiver and a tuning element for a built-in antenna whereby each step of movement of the main tuning means imparts the desired movement to the antenna tuning means.

A feature of the invention is the provision of a dipole antenna having a pair of sheet metal conductors electrically connected to a tuning coil having a movable core which is mechanically coupled to the main tuning means of the receiver.

Another feature is the provision of improved tuning means for a built-in dipole antenna in a television receiver comprising a tuning coil at the dipole having graduated turn spacings, and means coupling the core of said coil to the main tuning shaft of the receiver for automatically tuning the antenna as the receiver is tuned.

Still another feature is the provision of improved antenna tuning means in which a stepped cam on the main tuning shaft operates the movable core of a tuning coil at the fixed dipole antenna, through the medium of a flexible cable, for automatic tuning purposes.

The foregoing and other objects of the invention will be better understood from a study of the following description thereof taken in connection with the accompanying drawing, wherein.

Figures 2, 4:
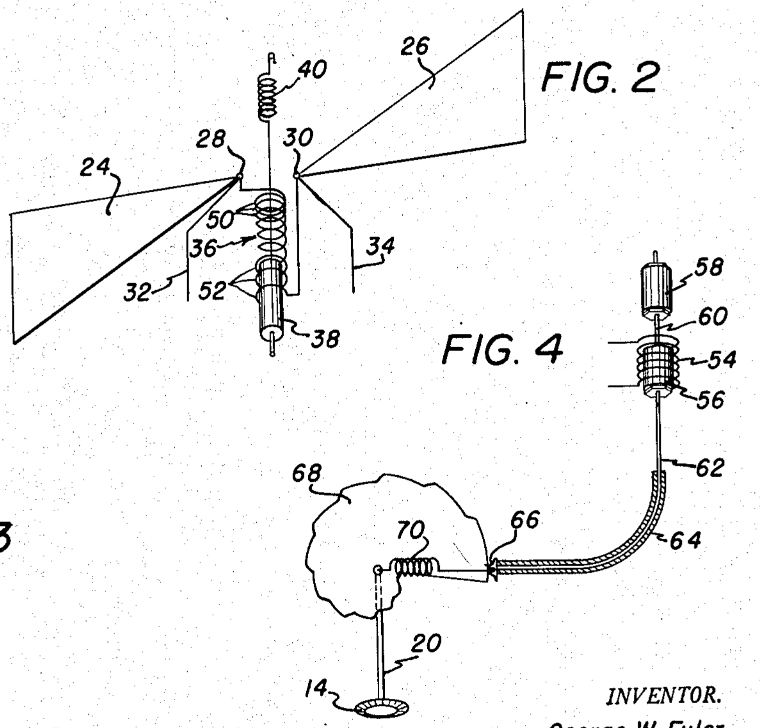
Fig. 2 is a schematic view of the dipole antenna and its tuning means.
Figure 3:
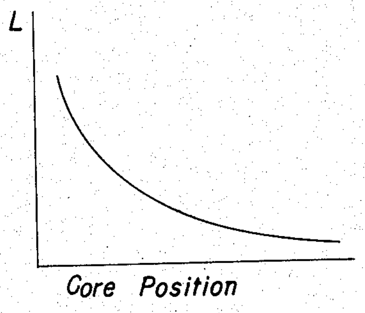

Fig. 3 graphically represents the inductance variation characteristic of the tuning means; and Fig. 4 schematically illustrates a modification of the antenna tuning means.

In practicing the invention, a television receiver is provided with a built-in antenna system including a pair of dipole elements made of sheet metal. The dipole elements are positioned within the receiver housing, with the nearest ends of the dipole elements being respectively connected to the terminals of a stationary tuning coil having a movable core therein. This core is mechanically coupled to the main tuning shaft of the receiver for movement therewith. In one embodiment of the invention the turns of the coil have graduated spacings such that the inductance will be proper for optimum tuning in all of the television channels. In a modified form of the invention the antenna tuning coil has uniformly spaced turns, and a dual core is employed, one part of the core serving to increase the coil inductance and the other part serving to reduce the coil inductance. This core structure is connected through a flexible cable to a stepped cam on the main tuning shaft so that the various sections of the core will be brought into play as needed to afford optimum tuning in all channels.

Figure 1:
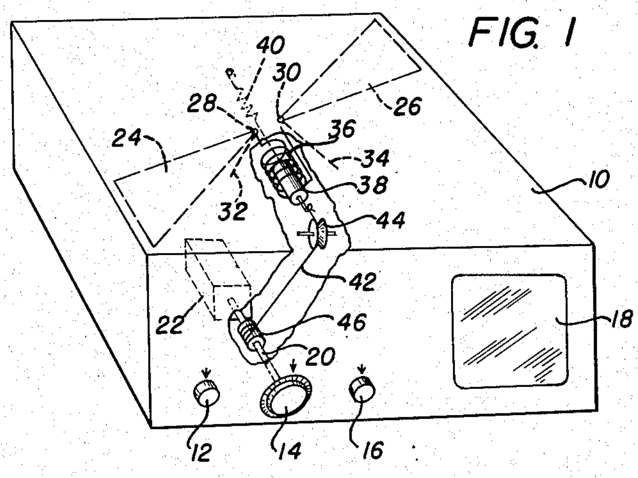
Fig. 1 is a front perspective view of a television receiver with a portion of the cabinet broken away to show one embodiment of an antenna system constructed in accordance with the principles of the invention.

In Fig. 1 there is represented a television receiver housed in a cabinet 10. While the particular receiver shown in this view is a table model, the principles of the invention may be applied to console receivers as well. On the front of the cabinet 10 there are disposed the usual control knobs, including a volume control knob 12, a channel selector knob 14 and a contrast control knob 16. A transparent window 18 is located in front of the picture tube screen in the usual fashion.

The selector knob 14 is mounted on a main tuning shaft 20 which operates a tuner unit indicated by the rectangle 22, Fig. 1. Suitable reactance elements are mounted in the unit 22 for tuning the receiver to the frequencies of the various broadcast channels. The selector knob 14 is turned through uniformly spaced steps to select the tuning elements for the various channels, as is generally understood. The tuning elements are arranged in groups, one for tuning an input circuit that is connected to the antenna, another for tuning the radio frequency amplifier, and another for tuning the local oscillator circuit. In accordance with the present invention, the movement of the main tuning shaft 20 is utilized also to tune the antenna itself.

The illustrated receiver utilizes a built-in dipole antenna having a pair of triangularly shaped dipole elements 24 and 26, Figs. 1 and 2. These elements 24 and 26 are made from copper foil or other suitable sheet metal and are cut for a wide-band response in the high television band (174 to 216 megacycles). A suitable insulating frame (not shown) supports the dipole elements 24 and 26 inside the cabinet 10, near the top thereof, as indicated in Fig. 1, with the apices of the triangular elements being spaced from each other by a small distance. The dipole elements 24 and 26 are represented in Fig. 1 as being fixed in position. However, it is also contemplated that they may be supported by a frame that can be swung through a 45-degree arc in either direction from a center position. The feed points 28 and 30 of the dipole are located respectively at the apices of the elements 24 and 26, and the transmission line conductors 32 and 34 lead from these feed points to the input circuit of the receiver.

For optimum reception in all channels, the antenna should be tunable over a range of frequencies extending from 54 megacycles to 216 megacycles, which are the present frequency limits of television broadcast channels in the very high frequency range. In the ordinary indoor type of antenna having adjustable arms, it may be necessary to adjust the actual length of the dipole elements and the orientation thereof each time a new channel is being tuned in. In the present case, however, the dipole elements 24 and 26 are fixed as to length, and in the illustrated embodiment they are fixed also as to their orientation (once the receiver is positioned in a desired location). Optimum tuning for each of the channels (particularly in the low band, which is the most critical) is obtained by means of a small tuning element that is a physical part of the antenna structure. The dipole antenna is predominantly capacitive in the lower channels, where it is less than ¼-wave length. Under these conditions, best results are had by using an inductive tuning element. This tends also to provide a better impedance match between the radiation resistance and the line surge impedance.

As shown in Figs. 1 and 2, a stationary coil 36 is suitably supported with its opposite ends connected respectively to the feed points 28 and 30 of the dipole elements 24 and 26. A ferromagnetic core 38 is axially movable within the coil 36. A tension spring 40 acting upon one end of the core 38 tends to draw the core into the coil 36. The other end of the core 38 is connected by a string 42 passed around a pulley 44 to a sleeve or small drum 46 on the main tuning shaft 20. As the shaft 20 is turned, the string 42 winds or unwinds, thereby positioning the core 38 within the coil 36. The angular position of the sleeve 46 on the shaft 20 is adjusted for resonance of the antenna at the lowest frequency, namely, that of television channel No. 2, where the inductance is the greatest.

The coil 36 is designed for optimum tuning of the antenna in all of the frequency channels, and is particularly useful in the low band. The core 38 moves in equal increments between channels, and the turns of the coil 36 are spaced unequally, with the spacings having a predetermined taper or graduation. The turns 50 at the inner end of the coil 36, where the core 38 is positioned for maximum inductance, are spaced closely together, while the turns 52 at the outer end of the coil 36 are spaced relatively far apart. This gives an inductance variation characteristic as represented in Fig. 3. For the lower frequency channels the change in inductance between channels is much greater than for the higher frequency channels. This corresponds with the manner in which the resonant frequency changes from channel to channel in the low band and in the high band. The dipole itself is broad-banded in the higher channels, so that the tuning there is not critical.

Fig. 4 illustrates an antenna tuning arrangement in which the tuning coil core may be moved in unequal increments between channels. The tuning coil 54, in this instance, is wound with uniformly spaced turns. The core structure consists of two slugs 56 and 58 mounted in longitudinally spaced relation on a threaded rod 60. The slug 56 is of ferromagnetic material such as iron, and the slug 58 is of non-magnetic material such as brass. At the low frequency end of the tuning range, the iron slug 56 is positioned within the coil 54 to give maximum inductance. As the frequency becomes higher, the slug 56 gradually moves out of the coil 54 and the slug 58 enters the coil 54. Because of the losses which occur in the non-magnetic slug 58, the effect of this slug is to reduce the inductance of the coil 54 below the value which it normally would have with an air core. Thus, a relatively wide range of inductance variation is obtained.

The core structure including the slugs 56 and 58 is connected by a flexible cable 62, extending through a guide tube 64, to a cam follower 66 that cooperates with a stepped cam 68 on the main tuning shaft 20. A tension spring 70 is extended between the follower 66 and the center of the cam 68 for maintaining the follower in cooperation with the cam. The steps on the cam 68 are graduated to position the slugs 56 and 58 accurately for tuning in the various frequency channels.

The disclosed invention satisfies the need for accurate and dependable built-in antennas in television receivers. It eliminates the manual tuning of the antenna which ordinarily is required, thereby making television receivers more nearly comparable with standard radio receivers in their ease of operation, and it ensures that the antenna is properly tuned automatically instead of leaving this to the skill of the user.

While there have been described what are at present considered to be the preferred embodiments of the invention, it will be understood that various modifications thereof may be made within the true spirit and scope of the invention as defined in the appended claims.

I claim:

1. An antenna system for a television receiver which includes a channel selecting tuner tunable through a high frequency range and also through a low frequency range spaced from said high frequency range, said antenna system including in combination, a pair of elongated spaced conductors having such length and being so positioned to form a dipole antenna responsive in the high frequency range, said elongated conductors forming a capacitive antenna in the low frequency range, a transmission line having a pair of conductors individually connected to said elongated conductors at the adjacent portions thereof, a coil having opposite ends thereof respectively connected to said adjacent ends of said elongated conductors, a core movable within said coil for varying the inductance thereof to tune said capacitive antenna for operation in the channels of said low frequency range, and a member operatively connected to said core and to said tuner for moving said core in response to the tuning of the receiver, whereby the inductance of said coil is varied by said core to automatically tune said capacitive antenna to the selected channel in said low frequency range and for matching the impedance of said antenna to the impedance of said transmission line.

2. An antenna system for a television receiver which includes a channel selecting tuner tunable through a high frequency range and also through a low frequency range spaced from said high frequency range, said antenna system including in combination, a pair of elongated spaced conductors having a length substantially equal to a quarter of a wave length in the high frequency range and being so positioned to form a dipole antenna in said high frequency range, said elongated conductors having a length substantially less than a quarter wave length in said low frequency range and forming a capacitive antenna in said low frequency range, a transmission line having a pair of conductors individually connected to said elongated conductors at the adjacent portions thereof, a coil having opposite ends thereof respectively connected to said adjacent ends of said elongated conductors, a core movable into said coil for increasing the inductance thereof to tune said capacitive antenna for operation in the channels of said low frequency range, and a member operatively connected to said core and to said tuner for moving said core in response to the tuning of the receiver to thereby vary the inductance of said coil, with the inductance of said coil being maximum for the lowest frequency in the low frequency range and said core being automatically withdrawn from said coil to reduce the inductance thereof and thereby tune said capacitive antenna to progressively higher frequency selected channels in said low frequency range and for matching the impedance of said antenna to the impedance of said transmission line.

3. In a television receiver, tuning means for the receiver tunable through a high band range of frequencies and a low band range of frequencies and including a rotatable shaft, an antenna within said receiver, said antenna including spaced elements each having a feed point, and forming a dipole antenna on the high band range of frequencies with element length less than a quarter wave length of any of the frequencies of the low band range to thus form a capacitive antenna in the low band range of frequencies, a transmission line including a pair of conductors connected to said feed point, a stationary coil connected in shunt across the feed points of said elements, said coil matching the impedance of the dipole form of said antenna to the impedance of said transmission line, a movable core for said coil for varying the inductance thereof, and motion-transmitting means coupling said core to said tuning shaft for automatically tuning the capacitive form of said antenna when the receiver is tuned in the low band range of frequencies.

4. In a television receiver, a cabinet housing said receiver, a rotatable tuning member disposed in the lower part of said cabinet for tuning said receiver through a high band range of frequencies and a low band range of frequencies, a dipole antenna disposed in the upper part of said cabinet to be resonant within the high band range of frequencies and to form a capacitive antenna for the low band range of frequencies, a transmission line including a pair of conductors connected to said dipole antenna, tuning means for the capacitive form of said antenna including a coil having a movable core for varying the inductance of said coil, said coil having a pair of end terminals connected to the common connections between said transmission line conductors and said dipole antenna, said said antenna tuning means being disposed adjacent to said antenna, said motion-transmitting means interconnecting said core and said tuning member for automatically tuning said antenna when the receiver is tuned through the low band range of frequencies.

5. In a television receiver, tuning means for the receiver including a shaft rotatable in equal steps for tuning the receiver to the respective frequency channels in a high band range of frequencies and a low band range of frequencies, an antenna within the receiver including a pair of spaced elements forming a dipole antenna for said high band range of frequencies and a capacitive antenna for said low band range of frequencies, a transmission line including a pair of conductors individually connected to said elements, tuning means for the capacitive form of said antenna including a coil bridging said elements and having a movable core therein, and motion-transmitting means including a flexible member connecting said core to said shaft for moving said core in proportion to the movement of said shaft, said coil having turns with graduated spacings for relating the movement of said core to the frequency channels for which the receiver is tuned in the low band range of frequencies.

6. In a television receiver, tuning means for the receiver including a rotatable shaft movable in equal steps for tuning the receiver to the various frequency channels in a high frequency range and a low frequency range spaced from said high frequency range, an antenna within the receiver including a pair of spaced elements forming a dipole antenna for said high frequency range and a capacitive antenna for said low frequency range, a transmission line including a pair of conductors individually connected to said elements, tuning means for the capacitive form of said antenna including a coil bridging said elements and a core movable therein, and motion-transmitting means including a flexible member connected to said core and also including an actuating portion on said shaft for moving said core in accordance with a predetermined non-linear relationship to the movement of said shaft, thereby tuning the capacitive form of said antenna to the frequency channels for which the receiver is tuned in the low frequency range.

7. In a television receiver, tuning means for the receiver including a rotatable shaft movable in equal steps for tuning the receiver to the various frequency channels in a high frequency range and a low frequency range spaced from said high frequency range, an antenna within the receiver including a pair of spaced elements forming a dipole antenna for said high frequency range and a capacitive antenna for said low frequency range, a transmission line including a pair of conductors individually connected to said elements, tuning means for the capacitive form of said antenna including a coil bridging said elements and a core movable therein, a stepped cam on said tuning shaft, a follower cooperating with said cam, and motion-transmitting means including a flexible member connecting said follower to said core for adjusting the resonant frequency of the capacitive form of said antenna to the tuning of the receiver in the low frequency range.

GEORGE W. FYLER.

REFERENCES CITED

The following references are of record in the file of this patent:

UNITED STATES PATENTS

| Number | Name | Date |
|---|---|---|
| 2,179,298 | Mauke | Nov. 7, 1939 |
| 2,206,820 | Mydlil | July 2, 1940 |
| 2,290,825 | Landon | July 21, 1942 |
| 2,469,168 | Loughlin | May 3, 1949 |
| 2,477,749 | Jacob | Aug. 2, 1949 |

OTHER REFERENCES

Radio and Television Retailing, September 1949, page 87.